US010400326B2

(12) United States Patent
Chaleix et al.

(10) Patent No.: US 10,400,326 B2
(45) Date of Patent: Sep. 3, 2019

(54) PAINTED STEEL SHEET PROVIDED WITH A ZINC COATING

(71) Applicant: ArcelorMittal SA, Luxembourg (LU)

(72) Inventors: Daniel Chaleix, Verny (FR); Daniel Jacques, Thionville (FR); Sergio Pace, Jodoigne (BE); Eric Silberberg, Haltinne (BE); Bruno Schmitz, Nandrin (BE); Xavier Vanden Eynde, Latinne (BE)

(73) Assignee: ArcelorMittal SA, Luxembourg (LU)

( * ) Notice: Subject to any disclaimer, the term of this patent is extended or adjusted under 35 U.S.C. 154(b) by 532 days.

(21) Appl. No.: 14/908,015

(22) PCT Filed: Aug. 1, 2013

(86) PCT No.: PCT/IB2013/001682
§ 371 (c)(1),
(2) Date: Aug. 2, 2016

(87) PCT Pub. No.: WO2015/015238
PCT Pub. Date: Feb. 5, 2015

(65) Prior Publication Data

US 2016/0340771 A1 Nov. 24, 2016

(51) Int. Cl.
*C23C 14/00* (2006.01)
*B32B 15/00* (2006.01)
(Continued)

(52) U.S. Cl.
CPC .............. *C23C 14/28* (2013.01); *B32B 15/00* (2013.01); *C23C 14/14* (2013.01); *C23C 14/16* (2013.01);
(Continued)

(58) Field of Classification Search
CPC ....... B32B 15/013; C25D 13/02; C23C 14/16; C23C 14/22
See application file for complete search history.

(56) References Cited

U.S. PATENT DOCUMENTS 4,650,724 A * 3/1987 Umino .................. C25D 3/565 420/520
5,834,128 A * 11/1998 Hamahara ................ B05D 7/16 428/626
(Continued)

FOREIGN PATENT DOCUMENTS

CN 1110195 A 10/1995
CN 1158366 A 9/1997
(Continued)

OTHER PUBLICATIONS

Machine translation of EP 0630987 (filed 1994). (Year: 1994).*
(Continued)

*Primary Examiner* — Mark Kopec
(74) *Attorney, Agent, or Firm* — Davidson, Davidson & Kappel, LLC

(57) ABSTRACT

A steel sheet is provided with a coating having at least one layer of zinc and a top layer of paint applied by cataphoresis. The zinc layer is deposited by a jet vapor deposition process in a deposition chamber maintained at a pressure between $6\cdot10^{-2}$ mbar and $2\cdot10^{-1}$ mbar. A fabrication method is also provided.

8 Claims, 2 Drawing Sheets

(51) Int. Cl.

| | |
|---|---|
| ***C25D 13/00*** | (2006.01) |
| ***C23C 14/28*** | (2006.01) |
| ***C25D 13/02*** | (2006.01) |
| ***C23C 14/16*** | (2006.01) |
| ***C23C 14/56*** | (2006.01) |
| ***C23C 28/00*** | (2006.01) |
| ***C25D 13/16*** | (2006.01) |
| ***C23C 14/58*** | (2006.01) |
| ***C23C 14/14*** | (2006.01) |
| ***C25D 13/12*** | (2006.01) |

(52) U.S. Cl.

CPC ............ *C23C 14/56* (2013.01); *C23C 14/562* (2013.01); *C23C 14/5886* (2013.01); *C23C 28/3225* (2013.01); *C23C 28/34* (2013.01); *C25D 13/02* (2013.01); *C25D 13/12* (2013.01); *C25D 13/16* (2013.01)

(56) References Cited

U.S. PATENT DOCUMENTS

| | | | | |
|---|---|---|---|---|
| 6,042,892 | A * | 3/2000 | Kim | C23C 24/00 118/309 |
| 6,242,105 | B1 | 6/2001 | Joseph et al. | |
| 6,524,458 | B2 | 2/2003 | Laminage | |
| 7,220,450 | B2 | 5/2007 | Schade van Westrum et al. | |
| 7,416,615 | B2 | 8/2008 | Bano et al. | |
| 8,481,120 | B2 | 7/2013 | Choquet et al. | |
| 2011/0000431 | A1 | 1/2011 | Banaszak et al. | |
| 2016/0222495 | A1* | 8/2016 | Chaleix | C23C 14/16 |

FOREIGN PATENT DOCUMENTS

| | | | |
|---|---|---|---|
| CN | 101575727 | A | 11/2009 |
| EP | 0630987 | A1 | 12/1994 |
| EP | 630987 | A1 | 12/1994 |
| EP | 0744705 | A2 | 11/1996 |
| EP | 2048261 | A1 | 4/2009 |
| IN | 2010MUM00494 | | 2/2012 |
| JP | S5983765 | A | 5/1984 |
| JP | H0441683 | A | 2/1992 |
| JP | 2004504487 | A | 2/2004 |
| JP | 2010522272 | A | 7/2010 |
| WO | 2003076673 | A2 | 9/2003 |

OTHER PUBLICATIONS

Schmitz, B. et al, "Jet Vapor Deposition, A Novel Vacuum Coating Technique with Superior Properties. JVD: UN Nouveau Procede de Revetement Sous Vide Pour des Produits a Proprietes Amelioress", Revue de Metallurgie—Cahiers D'Informations Techniques, p. 971-978, 97, 7, Paris, France.

* cited by examiner

PAINTED STEEL SHEET PROVIDED WITH A ZINC COATING

This invention relates to a steel sheet provided with a coating comprising a layer of zinc covered by paint, which is intended in particular for the fabrication of automobile parts, although it is not limited to that application.

BACKGROUND

Galvanized coatings comprising essentially zinc are conventionally used for the effective protection they provide against corrosion, whether in the automotive sector or in the construction industry, for example.

In the following text, a zinc coating means a coating of pure zinc, potentially including the unavoidable impurities acquired during production and present in trace quantities.

The sheets coated in this manner can then be cut and shaped, for example by stamping, bending or shaping, to form a part that can then be painted to form a paint film on top of the coating. This paint film is generally applied by cataphoresis.

The methods most frequently used to deposit a zinc coating on the surface of a steel sheet are galvanizing and electrogalvanizing. However, these conventional methods do not make it possible to coat grades of steel that contain high levels of oxidizable elements such as Si, Mn, Al, P, Cr or B, which has led to the development of new coating methods, and in particular vacuum deposition technologies such as jet vapor deposition (JVD).

BRIEF SUMMARY OF THE INVENTION

Nevertheless, the surfaces of the sheets coated according to these vacuum deposition methods, following the step of painting by cataphoresis, exhibit surface defects that adversely affect the aesthetic appearance of the shaped parts.

An object of the present invention is therefore to eliminate the disadvantages of steels coated using methods of the prior art by making available a steel sheet coated with zinc by vacuum deposition and a layer of paint that has a good surface appearance.

The present invention provides a steel sheet. The steel sheet has a coating with at least one layer of pure zinc and potential unavoidable impurities acquired during production and present in trace quantities, and a top layer of paint applied by cataphoresis. The zinc layer is the top layer of the coating before the application of the paint layer and the zinc layer is deposited by a jet vapor deposition process in a deposition chamber maintained at a pressure $P_{chamber}$ between $6 \cdot 10^{-2}$ mbar and $2 \cdot 10^{-1}$ mbar.

The sheet can also have the following characteristics, considered individually or in combination:

- the steel sheet is obtained by a method wherein the ratio between the pressure inside the deposition chamber $P_{chamber}$ and the pressure inside the zinc ejection chamber $P_{eject}$ is between $2 \cdot 10^{-3}$ and $5.5 \cdot 10^{-2}$;
- the steel sheet is obtained by a method wherein the distance d between the upper portion of the slot 8 of the ejection chamber 7 and the steel sheet to be coated is between 20 and 60 mm;
- a surface of the steel sheet has no more than 2.7 crater-type defects per square decimeter; and
- the coated steel is a Very High Strength steel.

The present invention further provides a method for the fabrication of a coated and painted sheet. The method includes the steps of the coating the sheet by a sonic vapor jet of zinc inside a deposition chamber maintained at a pressure $P_{chamber}$ between $6 \cdot 10^{-2}$ mbar and $2 \cdot 10^{-1}$ mbar.

The method can also have the following characteristics, considered individually or in combination:

- the ratio between the pressure $P_{chamber}$ inside the deposition chamber and the pressure $P_{eject}$ inside the ejection chamber is between $2 \cdot 10^{-3}$ and $5.5 \cdot 10^{-2}$; and
- a distance d between an upper portion of the slot 8 of the ejection chamber 7 and the steel sheet to be coated is between 20 and 60 mm.

Additional characteristics and advantages of the invention are described in greater detail below.

BRIEF DESCRIPTION OF THE DRAWINGS

To illustrate the invention, tests have been conducted and will be described by way of non-restricting examples, in particular with reference to the accompanying figures, in which.

DETAILED DESCRIPTION

The sheet coated according to the invention first comprises a steel substrate, preferably hot-rolled then cold-rolled so that it can be used for the fabrication of automobile body parts. The invention is not limited to this field, however, and can be used for any steel part regardless of its intended final use.

The steel substrate can in particular be one of the following grades of a VHS (Very High Strength steel, generally between 450 and 900 MPa) or UHS (Ultra High Strength, generally greater then 900 MPa) steel that contain high levels of oxidizable elements:

- steels without interstitial elements (IF, Interstitial Free), which can contain up to 0.1% by weight Ti;
- dual-phase steels such as DP 500 steels, up to DP 1200 steels, which can contain up to 3% by weight Mn in association with up to 1% by weight Si, Cr and/or Al,
- TRIP (TRansformation Induced Plasticity) steels such as TRIP 780 steel, which contains, for example, approximately 1.6% by weight Mn and 1.5% by weight Si;
- TRIP steels or dual phase steels containing phosphorus;
- TWIP (TWinning Induced Plasticity) steels with a high content of Mn (generally 17-25% by weight),
- low-density steels such as Fe—Al steels, which can contain up to 10% by weight Al, for example;
- stainless steels, which have a high concentration of chromium (generally 13-35% by weight), in association with other alloy elements (Si, Mn, Al etc.).

The steel sheet can optionally be coated with one or more additional layers in addition to the zinc layer in a manner appropriate to the desired properties of the final product. The zinc layer will preferably be the top layer of the coating.

Figure 1:
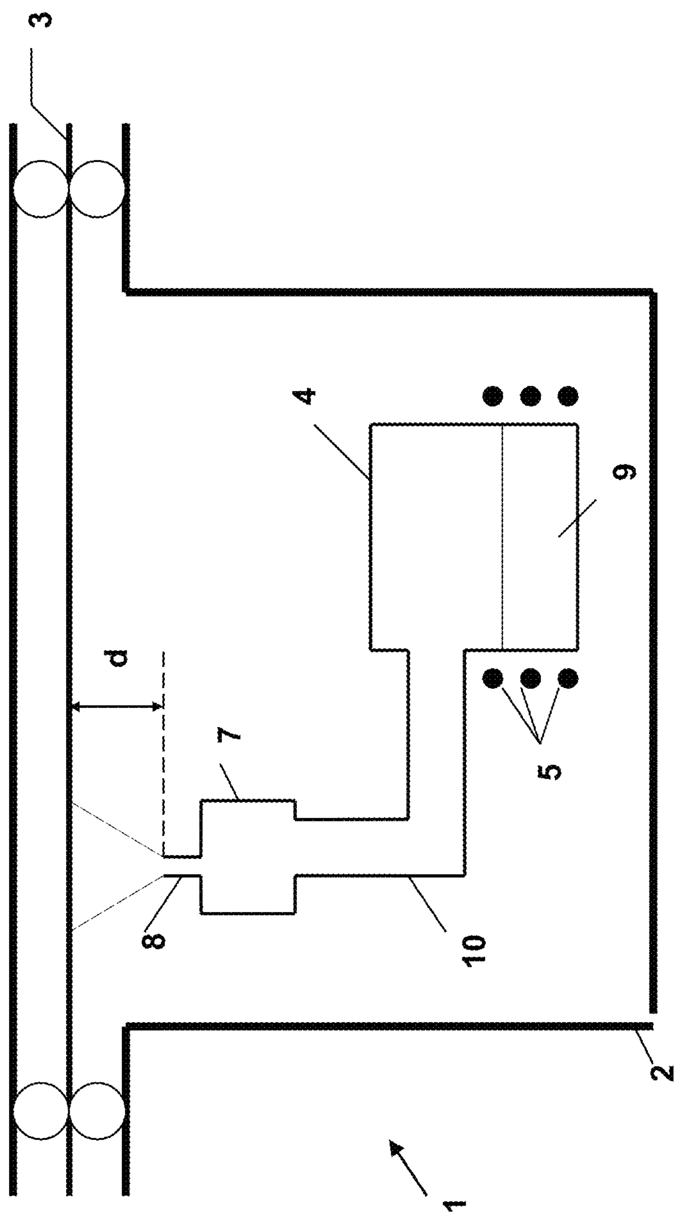
FIG. 1 illustrates a jet vapor deposition installation that can be used to carry out the method claimed by the invention.

A method for the fabrication of the steel sheet according to the invention is illustrated more particularly in FIG. 1, which shows an installation 1 that comprises a vacuum deposition chamber 2. This chamber comprises an entry lock and an exit lock (not shown), between which the steel sheet 3 to be coated circulates. The sheet 3 can be moved by any appropriate means, for example a rotating support roller on which the strip can be supported.

Situated facing the surface of the strip to be coated is an ejection chamber 7 equipped with a slot 8, the upper part of the slot 8 being situated at a distance d from the surface of the strip to be coated, of for example, between 20 and 60 mm. This chamber 7 is mounted on an evaporation crucible 4 that contains the liquid zinc 9 to be deposited on the surface of the steel strip 3. The evaporation crucible 4 is advantageously equipped with an induction-heating device 5 that makes possible the formation of the vapor. The vapor then escapes from the crucible via conduit 10 that conducts it to the ejection chamber 7 and the slot 8, which is preferably calibrated to form a jet directed toward the surface of the substrate to be coated. The presence of the slot 8 allows for the regulation of the mass flow of vapor, at a constant sonic speed along the slot (sonic throat) that has the advantage of achieving a uniform deposit. Reference to this technology is made below, using the acronym "JVD" (for Jet Vapor Deposition). Additional information on this technology is presented in patent EP07447056.

In another embodiment not illustrated, the crucible and the ejection chamber are one and the same part, comprising a slot directed toward the surface of the substrate to be coated. In this embodiment, the vapor created by heating the zinc rises directly toward the slot and forms a jet directed toward the surface of the substrate to be coated.

The pressure $P_{chamber}$ in the deposition chamber 2 is maintained at a pressure between $6 \cdot 10^{-2}$ mbar and $2 \cdot 10^{-1}$ mbar.

The pressure $P_{chamber}$ in the deposition chamber 2 and the pressure $P_{eject}$ in the ejection chamber 7 are optionally maintained so that the ratio $P_{chamber}$ to $P_{eject}$ is between $2 \cdot 10^{-3}$ and $5.5 \cdot 10^{-2}$, which allows for the improvement of the temporary protection of these coatings.

A layer of oil is optionally applied to the surface of the sheet thus coated to provide temporary protection when the sheet is stored in a wet and/or saline environment before delivery or the transformation into the final product.

The sheet 1, which may or may not have been subjected to a skin-pass step, can then be cut and shaped, for example by stamping, bending or shaping, to form a part that can then be painted to form a paint film on the coating.

For automotive applications, after a phosphate treatment, each piece is quenched in a cataphoresis bath and a layer of primer paint, a layer of base paint and optionally a finish varnish coat are applied in succession.

Before applying the cataphoresis layer to the part, the part is first de-greased then phosphatized to ensure the adherence of the cataphoresis layer.

The cataphoresis layer provides additional protection for the part against corrosion. The layer of primer paint, generally applied with a paint gun, prepares the final appearance of the part and protects it against grit and against UV radiation. The base paint layer gives the part its color and its final appearance. The varnish layer gives the surface of the part good mechanical strength, resistance to aggressive chemical agents and a good surface appearance.

Generally, the weight of the phosphate layer is between 1.5 and 5 g/m$^2$.

The paint films used to protect and guarantee an optimal surface appearance of the parts comprise, for example, a cataphoresis layer with a thickness of 15 to 25 μm, a layer of primer paint with a thickness of 35 to 45 μm and a layer of base paint with thickness of 40 to 50 μm.

In cases where the paint films also comprise a layer of varnish, the thicknesses of the different layers of paint are generally as follows:

- cataphoresis layer: between 15 and 25 μm, preferably less than 20 μm,
- layer of primer paint: less than 45 μm,
- layer of base paint: less than 20 μm, and
- layer of varnish: less than 55 μm.

The paint films can also not comprise a cataphoresis layer and comprise only one layer of primer paint and one layer of base paint, and optionally a layer of varnish.

Preferably, the total thickness of the paint films will be less than 120 μm, or even less than 100 μm.

Sometimes on the surface of the sheet following the application of the cataphoresis layer, crater-type defects are observed which, on steel sheets, are privileged sites for the origin of corrosion and significantly degrade the appearance of the surface of the sheet. These craters are in the form of truncated conical holes that emerge in the surface of the cataphoresis layer and can possibly extend through the coating to reach the surface of the steel substrate; they generally have a diameter between 100 and 500 μm at the base and between 5 and 20 μm at the summit.

The invention will now be explained below on the basis of tests performed by way of non-restricting examples.

Tests

Acceptance Criteria

To evaluate the sensitivity of the product to the risk of the appearance of crater-type defects, there is a criterion relative to the number of defects present on a coated steel sheet 10 cm×15 cm, after this sheet has been subjected to polishing. For the coated steel sheet to be accepted, it must have fewer than four defects per 10×15 cm$^2$ plate, which is equivalent to less than 2.7 defects per square decimeter.

Tests 3 series of cold-rolled IF steel sheets, type DC06, of the type marketed by ArcelorMittal, having a zinc coating 7.5 μm thick were built.

For both specimens, the coating was applied by JVD deposition at a different pressure in the deposition chamber, with a distance d between the upper part of the slot of the extraction [sic; ejection] chamber and the surface of the identical strip to be coated equal to approximately 35 mm.

| Specimen | Type of coating |
|---|---|
| 1 | JVD - pressure $<10^{-2}$ mbar in the deposition chamber |
| 2* | JVD - pressure $1.1 \cdot 10^{-1}$ mbar in the deposition chamber |

*According to the invention

The specimens were then coated with Quaker Ferrocoat oil N 6130 at 1.2 g/m$^2$±0.3 g/m$^2$, and then subjected to the phosphate and then cataphoresis steps. An image capture and processing device such as the commercially available TalySurf CLI 2000 then made it possible to calculate the number of crater-type defects as defined above present on the surface of the coated strip. These craters are in the form of truncated conical holes that emerge in the surface of the cataphoresis layer and can possibly extend through the coating to reach the surface of the steel substrate.

| Specimen | Number of defects |
|---|---|
| 1 | >>> 2.7 dm$^2$ [sic; 2.7/dm$^2$] (up to 1600/dm$^2$) |
| 2* | <2.7/dm$^2$ |

Specimen No. 2 according to the invention therefore satisfies the acceptance criterion, in contrast to specimen No. 1.

Figure 2:
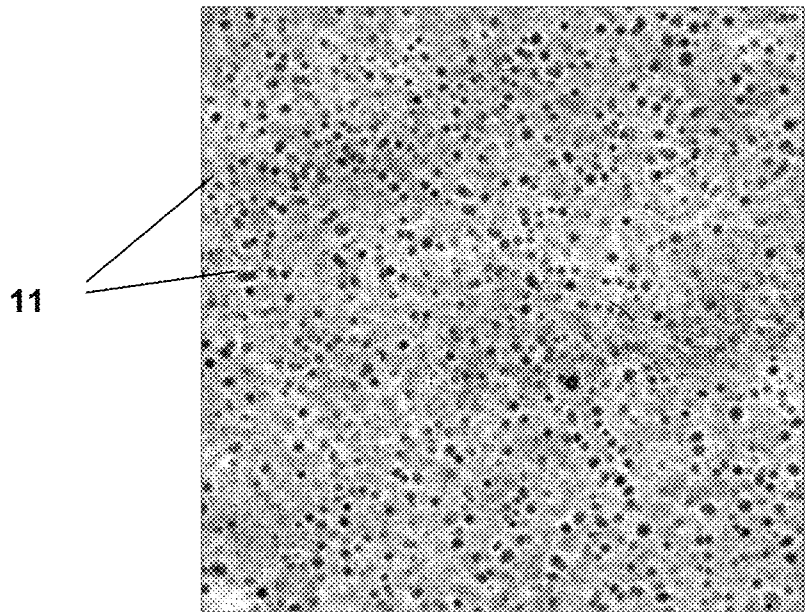
FIG. 2 is a photograph at an ×4 enlargement of a sheet coated according to the prior art.

FIG. 2 is an ×4 enlarged photograph of a steel sheet of the prior art to which a coat of paint has been applied using a cataphoresis process. This sheet of cold-rolled IF steel sheet of DC06 was coated with 7.5 μm of Zn using a JVD process in which the pressure in the deposition chamber was maintained at a pressure of less than $10^{-2}$ mbar, the distance d being equal to 35 mm. The sheet coated in this manner was coated with a layer of Quaker Ferrocoat oil N 6130 at 1.2 $g/m^2 \pm 0.3$ $g/m^2$ to provide a temporary protection of the surface, and was then subjected to a cataphoresis-painting step. Crater-type defects 11 as defined above were observed on the surface of this sheet. These defects significantly degrade the appearance of the surface of the sheet.

Figure 3:
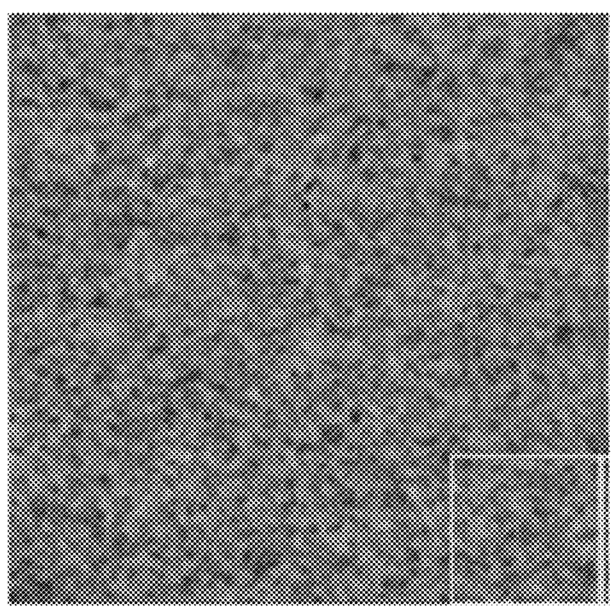
FIG. 3 is a photograph at an ×4 enlargement of a sheet coated according to the invention.

FIG. 3 is an ×4 enlarged photograph of a steel sheet according to the invention. This sheet of cold-rolled IF steel sheet of DC06 was coated with 7.5 μm of Zn, using a JVD process, whereby the pressure in the deposition chamber was maintained at a pressure of $1.1 \cdot 10^{-1}$ mbar, the distance d being equal to 35 mm. The sheet coated in this manner was coated with a layer of Quaker Ferrocoat oil N 6130 at 1.2 $g/m^2 \pm 0.3$ $g/m^2$ to provide a temporary protection of the surface, and was then subjected to a cataphoresis-painting step. The absence of crater-type defects on the surface of this steel sheet is apparent. The shades of gray that appear in the figure are related to the roughness of the surface of the steel sheet and are not related to defects in the sense described above.

The same results can be observed with the use of a Fuchs Anticorite oil RP 4107s at 1.2 $g/m^2$ instead of the Quaker Ferrocoat.

The inventors have also noted that the change in pressure inside the deposition chamber does not affect the rate of deposition of the coating on the surface of the steel sheet.

What is claimed is:

1. A coated steel sheet, the coating comprising:
- at least one layer of zinc; and a top layer of paint applied by cataphoresis;
- the at least one layer of zinc being the top layer of the coating before the application of the paint layer,
- the at least one layer of zinc deposited by a jet vapor deposition process in a deposition chamber maintained at a pressure $P_{chamber}$ between $6 \cdot 10^{-2}$ mbar and $2 \cdot 10^{-1}$ mbar;
- wherein a surface of the coated steel sheet has no more than 2.7 crater-type defects per square decimeter.

2. The coated steel sheet according to claim 1, wherein the at least one layer of zinc includes a layer of pure zinc and unavoidable impurities acquired during production and present in trace quantities.

3. The coated steel sheet according to claim 1, wherein the coated steel is a Very High Strength steel.

4. The coated steel sheet according to claim 1, wherein the top layer of paint has a thickness from 15 μm to 25 μm.

5. The coated steel sheet according to claim 4, wherein the top layer of paint has a thickness less than 20 μm.

6. A method for the fabrication of the coated steel sheet of claim 1 comprising the steps of:
- providing a sheet in a deposition chamber;
- maintaining a pressure $P_{chamber}$ inside a deposition chamber between $6 \cdot 10^{-2}$ mbar and $2 \cdot 10^{-1}$ mbar; and
- coating the sheet with a sonic vapor jet of zinc inside the deposition chamber.

7. The method according to claim 6, further comprising the step of:
- maintaining an ejection chamber that is located inside the deposition chamber at a pressure $P_{eject}$, a ratio of the pressure $P_{chamber}$ to $P_{eject}$ being between $2 \cdot 10^{-3}$ and $5.5 \cdot 10^{-2}$.

8. The method according to claim 6, wherein a distance d between an upper portion of a slot of the ejection chamber and the steel sheet to be coated is between 20 and 60 mm.

* * * * *